United States Patent [19]
Zhuang et al.

[11] Patent Number: 6,090,963
[45] Date of Patent: *Jul. 18, 2000

[54] ALKENE LIGAND PRECURSOR AND SYNTHESIS METHOD

[75] Inventors: Wei-Wei Zhuang; Tue Nguyen; Robert Barrowcliff, all of Vancouver, Wash.; David Russell Evans, Beaverton, Oreg.; Sheng Teng Hsu, Camas, Wash.

[73] Assignee: Sharp Laboratories of America, Inc., Camas, Wash.

[ * ] Notice: This patent is subject to a terminal disclaimer.

[21] Appl. No.: 09/281,722

[22] Filed: Mar. 30, 1999

Related U.S. Application Data
[60] Provisional application No. 60/107,892, Nov. 10, 1998.

[51] Int. Cl.[7] .................................................. C07F 1/08
[52] U.S. Cl. .......................... 556/112; 556/113; 556/117; 421/248.1
[58] Field of Search .................. 556/113, 117, 556/112; 421/248.1

[56] References Cited

U.S. PATENT DOCUMENTS

| | | | |
|---|---|---|---|
| 4,385,005 | 5/1983 | Doyle | 260/464 |
| 4,425,281 | 1/1984 | Doyle | 260/430 |
| 4,434,317 | 2/1984 | Doyle et al. | 585/845 |
| 5,085,731 | 2/1992 | Norman et al. | 156/646 |
| 5,096,737 | 3/1992 | Baum et al. | 427/38 |

OTHER PUBLICATIONS

Article entitled, "Alkene and Carbon Monoxide Derivatives of Copper (I) and Silver (I) B–Diketonates" by G. Doyle, K.A. Eriksen, and D. Van Engen, Organometallics, 1985, 4, 830–835.

Article entitled, "Low Temperature Chemical Vapor Deposition of High–Purity Copper from an Organometallic Source" by David B. Beach, Franscoise K. LeGouses, and Chao–Kun Hu, Chem. Mater, 1990, 2, 216–219.

Article entitled, "Chemical Vapor Depostion of Copper from Copper(I) Trimethylphosphine Compounds" by M.J. Hampden–Smith, T.T. Kodas, M. Paffett, J.D. Farr, and H.–K. Shin, Chem. Mater, 1990, 2, 636–639.

Article entitled, "A Novel Copper Complex and CVD Precursor: ($n^2$–2–Butyne)copper(I) Hexafluoroacetylacetonate", by Thomas H. Baum and Carl E. Larson, Chem. Mater, 1992, 4, 365–369.

Article entitled, "Chemical Vapor Deposited Copper from Alkyne Stabilized Copper (I) Hexafluoroacetylacetonate Complexes", by Thomas H. Baum and Carl E. Larson, J. Electrochem. Soc., vol. 140, 1, Jan. 1993, 154–158.

Article entitled, "Chemical Vapor Depostion of Copper Thin Films with (hexafluoroacetylacetonate)Cu(allyltrimethylsilane)", by Man–Young Park, Jong–Hoon Son, and Shi–Woo Rhee, Electrochemical and Solid–State Letters, 1 (1), 32–33, (1998).

(List continued on next page.)

*Primary Examiner*—Porfirio Nazario-Gonzalez
*Attorney, Agent, or Firm*—David C. Ripma; Matthew Rabdau

[57] ABSTRACT

A metal(hfac), alkene ligand precursor has been provided. The alkene ligand includes double bonded carbon atoms, with first and second bonds to the first carbon atom, and third and fourth bonds to the second carbon atom. The first, second, third, and fourth bonds are selected from a the group consisting of H, $C_1$ to $C_8$ alkyl, $C_1$ to $C_8$ haloalkyl, and $C_1$ to $C_8$ alkoxyl. As a general class, these precursors are capable of high metal deposition rates and high volatility, despite being stable in the liquid phase at low temperatures. Copper deposited with this precursor has low resistivity and high adhesive characteristics. A synthesis method has been provided which produces a high yield of the above-described alkene ligand class of metal precursors.

26 Claims, 6 Drawing Sheets

OTHER PUBLICATIONS

Abstract entitled, "MOCVD of Copper from the Solution of New and Liquid Precursor (hfac)Cu(1–pentene)", by H.–K. Shin, Y.–H. Cho, D.–J. Yoo, H.–J. Shin, and E.–S. Lee, Materials Research Soc. Symp. Proc., vol. 514, 301, (1998).

Abstract entitled, "Hexafluoroacetylacetonate Cu Vinylcyclohexane as a Liquid Precursor for Low Temperature Chemical Vapor Deposition of Copper Thin Films", by Sang–Woo Kang, Man–Young Park, and Shi–Whoo Rhee, Electrochemical and Solid–State Letters, 2 (1), 22–23. (1999).

ALKENE LIGAND PRECURSOR AND SYNTHESIS METHOD

BACKGROUND AND SUMMARY OF THE INVENTION

This invention claims the benefit of a provisional application Ser. No. 60/107,892, filed Nov. 10, 1998, entitled "Improved Copper Precursor and Synthesis Method".

This invention relates generally to integrated circuit processes and fabrication, and more particularly, to a precursor and synthesis method, having an alkene ligand, which improves volatility, and which is capable of depositing copper at high deposition rates, low resistivity, and with good adhesion on selected integrated circuit surfaces.

The demand for progressively smaller, less expensive, and more powerful electronic products, in turn, fuels the need for smaller geometry integrated circuits (ICs) on larger substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the area of the interconnecting surfaces is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand process environments of volatile ingredients. Aluminum and tungsten metals are often used in the production of integrated circuits for making interconnections or vias between electrically active areas. These metals are popular because they are easy to use in a production environment, unlike copper which requires special handling.

Copper (Cu) would appear to be a natural choice to replace aluminum in the effort to reduce the size of lines and vias in an electrical circuit. The conductivity of copper is approximately twice that of aluminum and over three times that of tungsten. As a result, the same current can be carried through a copper line having nearly half the width of an aluminum line.

The electromigration characteristics of copper are also much superior to those of aluminum. Aluminum is approximately ten times more susceptible than copper to degradation and breakage due to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore barriers are typically erected to prevent copper from migrating. Elements of copper migrating into these semiconductor regions can dramatically alter the conduction characteristics of associated transistors. Another problem with the use of copper is the relatively high temperature needed to deposit it on, or removing it from, an IC surface. These high temperatures can damage associated IC structures and photoresist masks.

It is also a problem to deposit copper onto a substrate, or in a via hole, using the conventional processes for the deposition of aluminum when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, first, a physical vapor deposition (PVD)), and then, a chemical vapor deposition (CVD) technique, have been developed by the industry.

With the PVD technique, an IC surface is exposed to a copper vapor, and copper is caused to condense on the surfaces. The technique is not selective with regard to surfaces. When copper is to be deposited on a metallic surface, adjoining non-conductive surfaces must either be masked or etched clean in a subsequent process step. As mentioned earlier, photoresist masks and some other adjoining IC structures are potentially damaged at the high temperatures at which copper is processed. The CVD technique is an improvement over PVD because it is more selective as to which surfaces copper is deposited on. The CVD technique is selective because it is designed to rely on a chemical reaction between the metallic surface and the copper vapor to cause the deposition of copper on the metallic surface.

In a typical CVD process, copper is combined with a ligand, or organic compound, to help insure that the copper compound becomes volatile, and eventually decomposes, at consistent temperatures. That is, copper becomes an element in a compound that is vaporized into a gas, and later deposited as a solid when the gas decomposes. Selected surfaces of an integrated circuit, such as diffusion barrier material, are exposed to the copper gas, or precursor, in an elevated temperature environment. When the copper gas compound decomposes, copper is left behind on the selected surface. Several copper gas compounds are available for use with the CVD process. It is generally accepted that the configuration of the copper gas compound, at least partially, affects the ability of the copper to be deposited on to the selected surface.

Copper metal thin films have been prepared via chemical vapor deposition by using many different kinds of copper precursors. In 1990, D. B. Beach et al. *Chem. Mater.* (2) 216 (1990) obtained pure copper films via CVD by using ($\eta^5$—$C_5H_5$)Cu(PMe$_3$), and later, in 1992, H. K. Shin et al., *Chem. Mater.* (4) 788 (1992) declared the same results by using (hfac)Cu(PR$_3$)$_n$ (R=methyl and ethyl and n=1 and 2). However, these copper precursors are solids, which can not be used in the liquid delivery system for copper thin film CVD processing. Furthermore, the copper films often contain contamination of carbon and phosphorus, which can not be used as interconnectors in microprocessors.

$Cu^{2+}$(hfac)$_2$, or copper (II) hexafluoroacetylacetonate, precursors have previously been used to apply CVD copper to IC substrates and surfaces. However, these $Cu^{2+}$ precursors are notable for leaving contaminates in the deposited copper, and for the relatively high temperatures that must be used to decompose the precursor into copper.

The studies of copper precursors conducted in the early of 1990's were concentrated on the evaluation of a series of copper(I) fluorinated β-diketonate complexes, which have been proven to be very promising sources for the use in the chemical vapor deposition of copper metal thin films. Copper(I) fluorinated β-diketonate complexes were first synthesized by Gerald Doyle, U.S. Pat. Nos. 4,385,005 (1983) and 4,425,281 (1984), in which he presented the synthesis method and their application in the separation of unsaturated organic hydrocarbons. In the U.S. Pat. No. 5,096,737 (1992), Thomas H. Baum, et at., claimed the application of these copper(I) fluorinated β-diketonate complexes as copper precursors for CVD copper thin film preparation. Copper thin films have been prepared via chemical vapor deposition using these precursors.

Among several liquid copper precursors, 1,5-dimethyl 1,5-cyclooctadiene copper(I) hexafluoroacetylacetonate mixed with 1,6-dimethyl 1,5-cyclooctadiene copper(I) hexafluoroacetylacetonate ((DMCOD)Cu(hfac)) and hexyne copper(I) hexafluoroacetylacetonate ((HYN)Cu(hfac)) were evaluated in derail. The copper thin films deposited using (DMCOD)Cu(hfac) have very good adhesion to metal or metal nitride substrates, but a high resistivity (2.5 $\mu\Omega$cm) and a low deposition rate. (HYN)Cu(hfac) copper film has poor adhesion to a TiN substrate, and high resistivity (~2.1 $\mu\Omega$·cm). Another compound, butyne copper(I)(hfac), ((BUY)Cu(hfac)), gives a copper film with low resistivity (1.93 $\mu\Omega$cm), but has poor adhesion and is relatively expensive. Also, the compound is a solid and, therefore, difficult to use in a liquid delivery system. The invention of copper (I)(hfac) stabilized with a series of trialkylvinylsilane (John A. T. Norman et al., U.S. Pat. No. 5,085,731 (1992)) improved the properties of copper thin films.

Copper films deposited using a liquid copper precursor, (hfac)Cu(TMVS), where TMVS=trimethylvinylsilane, have low resistivities and reasonably adhesion to substrates. This precursor is useful because it can be used at relatively low temperatures, approximately 200° C. This liquid copper precursor has been used for the preparation of copper metal thin films via CVD for some time, but there are still some drawbacks: stability, the adhesion of copper films, and cost for the trimethylvinylsilane stabilizer. Also, the precursor is not especially stable, and can have a relatively short shelf life if not refrigerated. Various ingredients have been added to (hfac)Cu(tmvs) to improve its adhesiveness, temperature stability, and the rate at which it, can be deposited on an IC surface. U.S. Pat. No. 5,744,192, entitled "Method Of Using Water To Increase The Conductivity Of Copper Deposited With Cu(HFAC)TMVS", invented by Nguyen et al., discloses a precursor and method of improving the electrical conductivity of Cu deposited with (hfac)Cu(tmvs).

It is generally acknowledged in the industry that (hfac)Cu(tmvs) becomes unstable, and begins to decompose, above 35° C. Use of a (hfac)Cu(tmvs) precursor stored at this temperature leads to undesirable process results. The effectivity of (hfac)Cu(tmvs) stored at temperatures lower than 35° C. is also unpredictable. A "fresh" batch of precursor, or precursor stored at temperatures well below room temperature, is used to guarantee predictable processes.

A Cu precursor comprising a ligand of methoxy and methyl groups is disclosed in co-pending application Ser. No. 08/779,640, filed Jan. 7, 1997, entitled "Precursor with (Methoxy)(methyl)silylolefin Ligands to Deposit Cu and Method for Same", invented by Senzaki et al., and assigned to the same assignee as the instant patent. The disclosed precursor permits either one or two methoxy groups to be bonded to the silicon atom of the ligand. That is, the precursor can be "fine tuned" using ligands having more methoxy groups than tmvs, but less than tmovs are provided. The oxygen atoms in the methoxy groups contribute electrons to the Cu atoms, to strengthen the Cu-olefin bond, and so, prevent the premature decomposition of the precursor in storage, or as the precursor is heated for the application of Cu to an IC surface. However, only hydrocarbon groups of one carbon atom, $CH_3$ (methyl) and $OCH_3$ (methoxy), are disclosed.

A Cu precursor comprising a ligand of alkyl and alkyl groups is disclosed in U.S. Pat. No. 5,767,301, entitled "Precursor with (Alkyloxy)(Alk,)silylolefin Ligands to Deposit Copper", invented by Senzaki et al. The disclosed precursor describes alkyl groups bonded to the silicon atom of the ligand with alkoxyl groups. However, the search continues for even more effective copper precursors.

Wei-Wei Zhuang et al., in co-pending patent application Ser. No. 09/210,099, entitled "Substituted Phenylethylene Precursor and Synthesis Method", filed Dec. 10, 1998, disclose a volatile copper precursor compound comprising $Cu^{+1}$(hexafluoroacetylacetonate), and a substituted phenylethylene ligand including one phenyl group bonded to a first carbon atom. The remaining bond to the first carbon atom is selected from a first group consisting of $C_1$ to $C_6$ alkyl, $C_1$ to $C_6$ haloalkyl, $C_1$ to $C_6$ phenyl, and $C_1$ to $C_6$ alkoxyl, and in which a second carbon atom includes a second and third bond. The second and third bonds are selected, independent of each other, from the group consisting of H, $C_1$ to $C_6$ alkyl, $C_1$ to $C_6$phenyl, and $C_1$ to $C_6$ alkoxyl.

Wei-Wei Zhuang et al., in co-pending patent application Ser. No. 09/215,921, entitled "Substituted Ethylene Precursor and Synthesis Method", filed Dec. 18, 1998, disclose a volatile metal (M) precursor compound for the chemical vapor deposition (CVD) of metal to selected surfaces. The metal is selected from the group consisting of copper (Cu), silver (Ag), and iridium (Ir). The precursor compound comprises $M^{+1}$(hexafluoroacetylacetonate), and a substituted ethylene ligand with a first carbon atom including a first and second bond. The first and second bonds are selected from groups independent of each other. The first bond is selected from a group consisting of $C_1$ to $C_8$ alkyl, $C_1$ to $C_8$ haloalkyl, and $C_1$ to $C_8$ alkoxyl. The second bond is selected from a group consisting of H, $C_1$ to $C_8$ alkyl, $C_1$ to $C_8$ haloalkyl, and $C_1$ to $C_8$ alkoxyl. A second carbon atom includes a third and fourth bond. The third and fourth bonds are selected, independent of each other, from the group consisting of H, $C_1$ to C8 alkyl, $C_1$ to $C_8$ haloalkyl, and $C_1$ to $C_8$ alkoxyl.

Wei-Wei Zhuang et al., in co-pending application Ser. No. 09/281,731, entitled "Allyl-Derived Precursor and Synthesis Method", filed on Mar. 30, 1999, disclose a series of precursors made with allyl-derived ligands. The allyl-derived ligand includes a first carbon atom double bonded to a second carbon atom. The first carbon atom has a first bond to a methylene and a second bond to an hydrogen (H) molecule. The second carbon has a third bond to an H molecule and a fourth bond to an H molecule. The methylene has a further bond to a molecule selected from the group consisting of alkyl, phenyl, trialkylsilane, trialkoxylsilane, halodialkylsilane, dihaloalkylsilane, trihalosilane, triphenylsilane, alkoxyl, halogen, chloroformate, cynanide, cycloalkyl, cycloalkylamine, alkyl ether, isocyanate, pentafluorobenzene.

As mentioned by Norman et al. in U.S. Pat. No. 5,085,731 (col. 9, line 28 to col. 10, line 31), precursors have been made with simple linear olefins such as 1-hexene. Disproportionation occurred when a distillation of such precursors was attempted. Norman et al. conclude that silylolefin compounds are necessary for the synthesis of isolable volatile liquid precursors, and that comparable hydrocarbons, such as 1-hexene, would not be suitable as precursors in atmospheric pressure or low pressure CVD (LPCVD) processes. However, H-K Shin, et al., in "MOCVD of Copper from the Solution of New and Liquid Precursor", Abstract, Mat. Res. Soc. Symp. Proc. Vol. 514, 1998 Material Research Society, pp. 301, claim the fabrication of (hfac)(Cu)(1-pentene).

It would be advantageous if a copper precursor was found that effectively deposits copper with low resistivity and good adhesion properties. It would be further advantageous if this precursor was inexpensive to synthesize.

It would be advantageous if a method were found of making a Cu(hfac) precursor stable over a wider range of temperatures, and to provide that the precursor remain in liquid phase during storage.

It would be advantageous if a precursor could be developed which encouraged a stable $Cu^{+1}$(hfac) bond without the use of silylolefins directly bonded to olefinic double bonds. Further, it would minimize silicon contamination if a precursor could be developed without the use of silylolefin groups, at all.

It would be advantageous if a metal precursor could be developed which made use of alkene ligands to stabilize the precursor.

Accordingly, a volatile metal (M) precursor compound for the chemical vapor deposition (CVD) of metal, such as copper, silver, and iridium to selected surfaces is provided. The precursor compound comprises a $M^{+1}$ (hexafluoroacetylacetonate) and an alkene ligand. The alkene ligand includes a first and second bond to a first carbon atom and a third and fourth bond to a second carbon atom. The two carbon atoms are double bonded to each other. The first, second, third, and fourth bonds are independently variable, and selected from a the group consisting of H, $C_1$ to $C_8$ alkyl, $C_1$ to $C_8$ haloalkyl, and $C_1$ to $C_8$ alkoxyl. In this manner, a stable precursor capable of high metal deposition rates is formed.

For example, the first through fourth bonds are varied to form 2,4,4-trimethyl-1-pentene, 3, 3-dimethyl-1-butene, 2, 3-dimethyl-1-butene, 2-methyl-2-butene, 1-hexene, 1-pentene, and 1-decene ligands, to name but a few possibilities.

In one alternative of the invention, the compound includes an additive to create a precursor blend. Then, the precursor blend comprises less than approximately 10% alkene, as measured by weight ratio of the precursor compound, to facilitate a stable liquid phase precursor.

A method for synthesizing a copper(hfac) alkene ligand precursor is also provided. The method comprises the steps of:

a) forming a uniformly mixed solution of $Cu_2O$ in a solvent, such as dichloro methane and tetrahydrofuran (THF);

b) introducing an alkene ligand to the solution of Step a), and forming a uniformly mixed solution;

c) introducing hexafluoroacetylacetone (hfac) to the solution of Step b), and forming a uniformly mixed solution;

d) filtering the solution to remove solid materials, whereby any excess $Cu_2O$ is removed;

e) removing the solvent from the solution; and f) filtering to remove the solid material, whereby a liquid phase precursor is formed.

In one example, Step a) includes the $Cu_2O$ being, in proportion, 0.310 mol, Step 1)) includes 2,4,4-trimethyl-1-pentene being, in proportion, 0.48 mol, and Step c) includes the hfac being, in proportion, 0.48 mol. Other examples are provided, as described in detail below.

In some aspects of the invention, a further step follows Step f), of:

g) adding less than approximately 10%, by weight ratio, of the alkene used in Step b) to the solution, whereby the liquid phase stability of the precursor is improved. Approximately 4.7% alkene additive is added in some aspects of the invention.

DETAILED DESCRIPTION OF THE PREFERRED EMBODIMENT

The alkene metal precursor, disclosed below, is inexpensive to synthesize. Compared to trimethylvinylsilane, which costs approximately $180 per 100 g, the general class of alkene ligands are inexpensive. Many of these alkene precursors are stable at room temperature for easy storage and handling. Despite retaining liquid phase at room temperature, many alkene ligand precursors are highly volatile at higher temperatures. Therefore, no decomposition occurs in the CVD liquid delivery line and vaporizer, which requires precursor stability at 90 degrees C., under vacuum, for four minutes. Further, many of the alkene ligand precursors have excellent adhesion to metal and metal nitride substrates, such as W, Ti, TiN, Ta, TaN, Al, Pt, WN, and similar barrier materials. The copper deposited with many of these precursors has low resistivity (<1.9 $\mu\Omega$·cm), high electromigration resistance, and excellent conformality to severe surface morphology.

Figure 1:
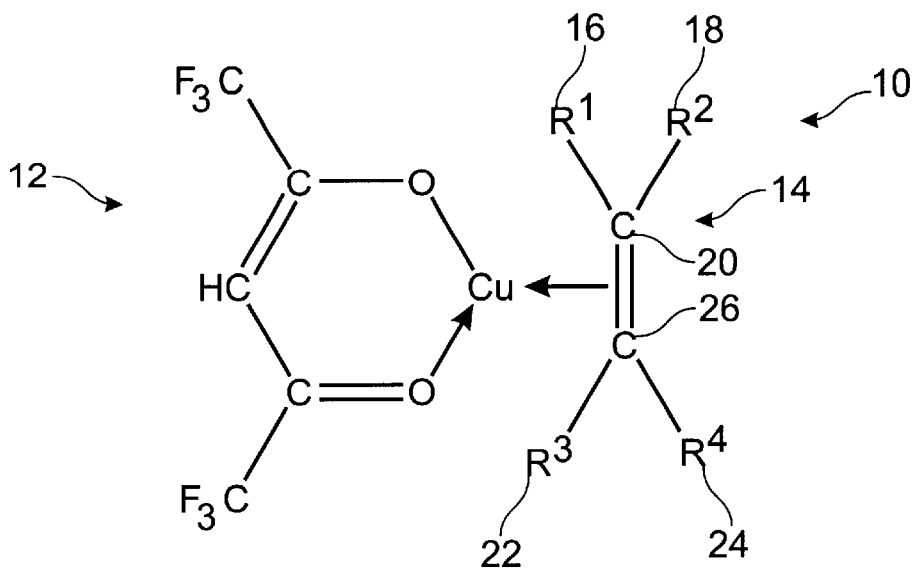
FIG. 1 is a schematic representation of the present invention precursor with in alkene ligand.
Figure 2:
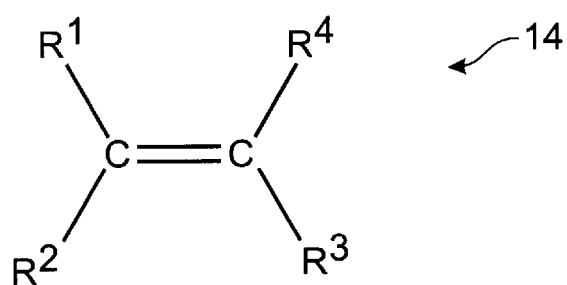
FIG. 2 is a schematic representation of the alkene ligand of FIG. 1.

FIG. 1 is a schematic representation of the present invention precursor with an alkene ligand. A volatile metal (M) precursor compound 10 for the chemical vapor deposition (CVD) of metal to selected surfaces comprises $M^{+1}$ (hexafluoroacetylacetonate) 12 and an alkene ligand 14. The metal of metal precursor 10 is selected from the group consisting of copper, silver, and iridium. FIG. 2 is a schematic representation of alkene ligand 14.

Metal precursor 10 includes a first 16 and second 18 bond to a first carbon atom 20. Metal precursor 10 also includes a third 22 and fourth 24 bond to a second carbon atom 26. First 16, second 18, third 22, and fourth 24 bonds vary independently from each other, and are selected from a the group consisting of H, $C_1$ to $C_8$ alkyl, $C_1$ to $C_8$ haloalkyl, and $C_1$ to $C_8$ alkoxyl, whereby a stable precursor capable of high metal deposition rates is formed.

Figure 3:
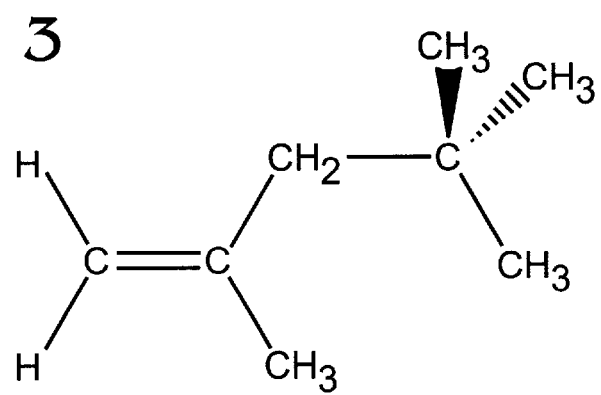
FIG. 3 is a schematic representation of a 2,4,4-trimethyl-1-pentene ligand.
Figure 4:
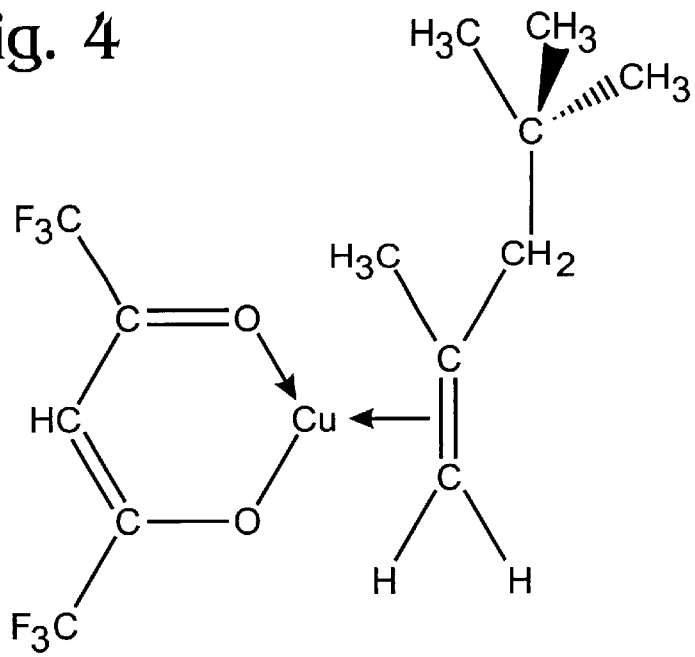
FIG. 4 is a schematic representation of a Cu precursor with the 2,4,4-trimethyl-1-pentene ligand of FIG. 3.

The various combination of bond options yields thousands of possibilities of alkene ligands. A few examples are mentioned below. FIG. 3 is a schematic representation of a 2,4,4-trimethyl-1-pentene ligand. The order of the bonds are defined in FIG. 1, however, the specific ordering is arbitrary. The first bond is H, the second is H, the third bond is $CH_2C(CH_3)_3$, and the fourth bond is $CH_3$. FIG. 4 is a schematic representation of a Cu precursor with 2,4,4-trimethyl-1-pentene ligand of FIG. 3.

Figure 5:
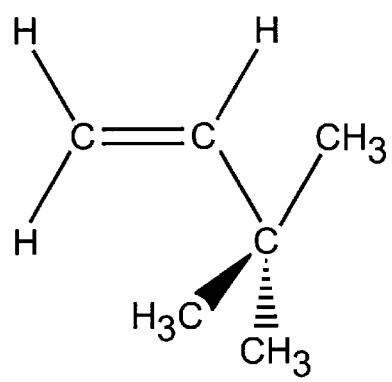
FIG. 5 is a schematic representation of a 3,3-dimethyl-1-butene ligand.
Figure 6:
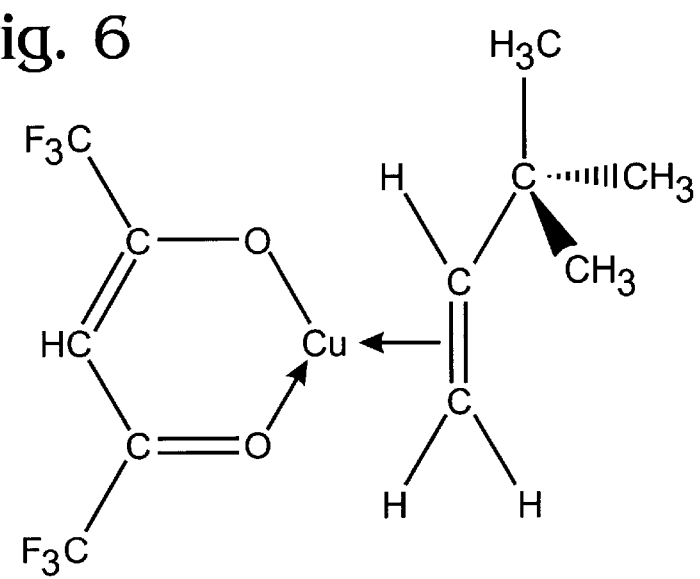
FIG. 6 is a schematic representation of a Cu precursor with the 3,3-dimethyl-1-butene ligand of FIG. 5.

FIG. 5 is a schematic representation of a 3,3-dimethyl-1-butene ligand. The first bond is H, the second bond is H, the third bond is $C(CH_3)_3$, and the fourth bond is H. FIG. 6 is a schematic representation of a Cu precursor with 3,3-dimethyl-1-butene ligand of FIG. 5.

Figure 7:
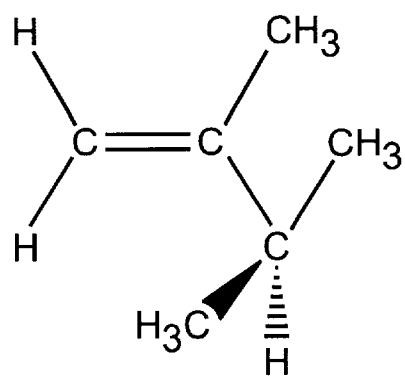
FIG. 7 is a schematic representation of a 2,3-dimethyl-1-butene ligand.
Figure 8:
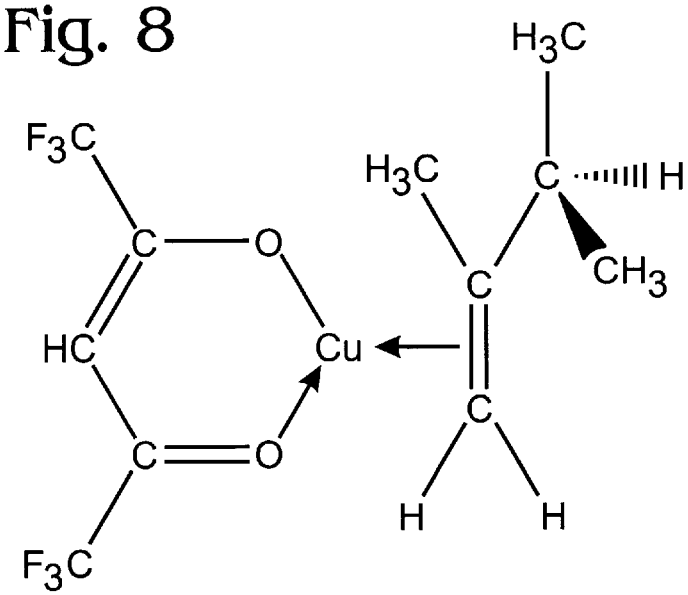
FIG. 8 is a schematic representation of a Cu precursor with the 2,3-dimethyl-1-butene ligand of FIG. 7.

FIG. 7 is a schematic representation of a 2,3-dimethyl-1-butene ligand. The first bond is H, the second bond is H, the third bond is $CH_3$, and the fourth bond is $CH(CH_3)_2$. FIG. 8 is a schematic representation of a Cu precursor with 2,3-dimethyl-1-butene ligand of FIG. 7.

Figure 9:
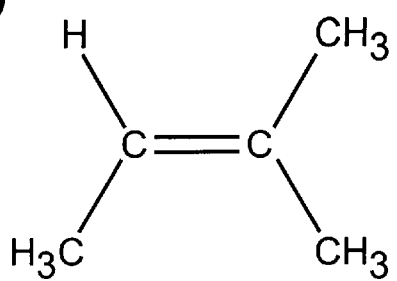
FIG. 9 is a schematic representation of a 2-methyl-2-butene ligand.
Figure 10:
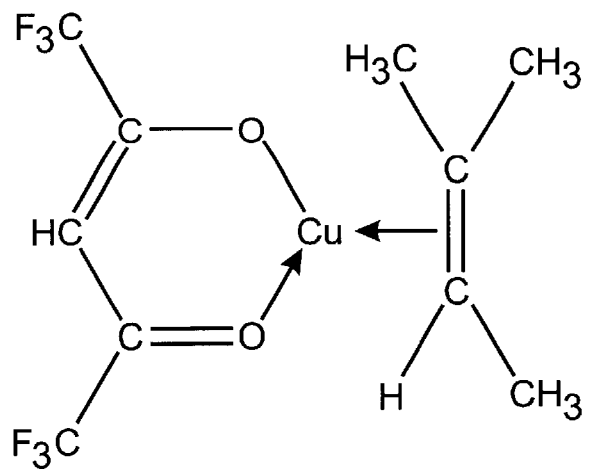
FIG. 10 is a schematic representation of a Cu precursor with the 2-methyl-2-butene ligand of FIG. 9.

FIG. 9 is a schematic representation of a 2-methyl-2-butene ligand. The first bond is H, the second bond is $CH_3$, the third bond is $CH_3$, and the fourth bond is $CH_3$. FIG. 10 is a schematic representation of a Cu precursor with 2-methyl-2-butene ligand of FIG. 9.

Figure 11:
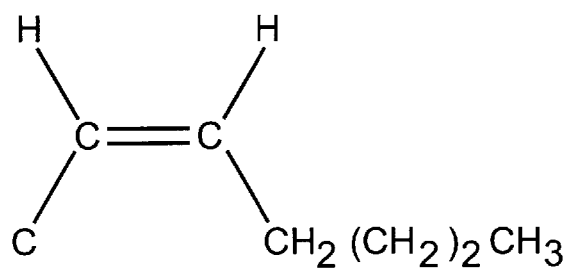
FIG. 11 is a schematic representation of a 1-hexene ligand.
Figure 12:
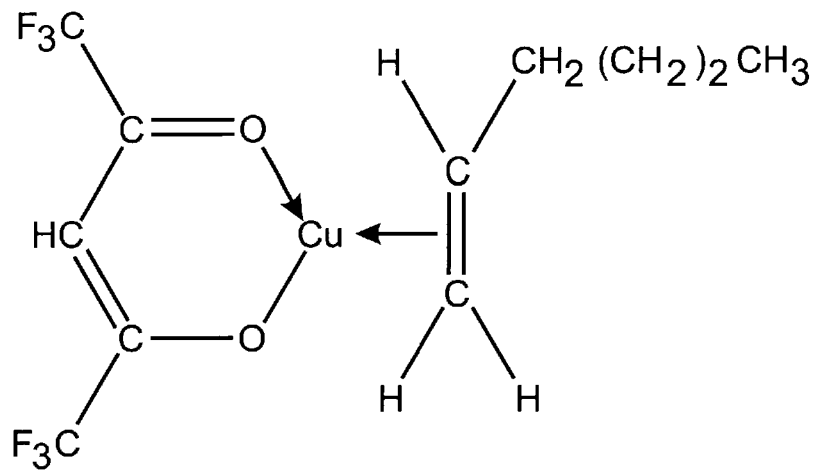
FIG. 12 is a schematic representation of a Cu precursor with the 1-hexene ligand of FIG. 11.

FIG. 11 is a schematic representation of a 1-hexene ligand. First bond is H, second bond is H, the third bond is $CH_2(CH_2)_2CH_3$, and the fourth bond is H. FIG. 12 is a schematic representation of a Cu precursor with 1-hexene ligand of FIG. 11.

Figure 13:
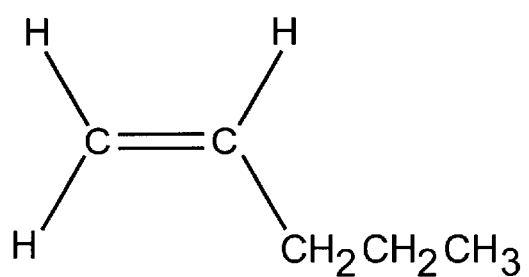
FIG. 13 is a schematic representation of a 1-pentene ligand.
Figure 14:
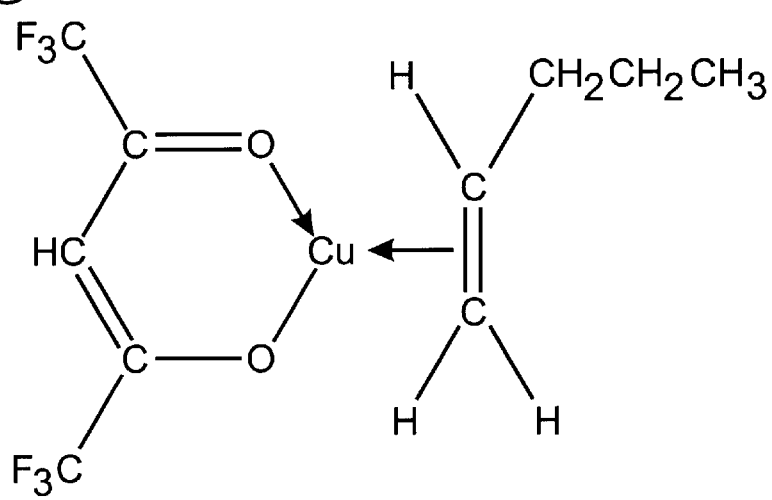
FIG. 14 is a schematic representation of a Cu precursor with the 1-pentene ligand of FIG. 13.

FIG. 13 is a schematic representation of a 1-pentene ligand. The first bond is H, the second bond is H, the third bond is $CH_2CH_2CH_3$, and the fourth bond is H. FIG. 14 is a schematic representation of a Cu precursor with 1-pentene ligand of FIG. 13. In some aspects of the invention, the 1-pentene ligand precursor compound includes an additive to create a precursor blend. The precursor blend comprises:

less than approximately 10% 1-pentene (see FIG. 13), as measured by weight ratio of the precursor compound, to facilitate a stable liquid phase precursor.

Figure 15:
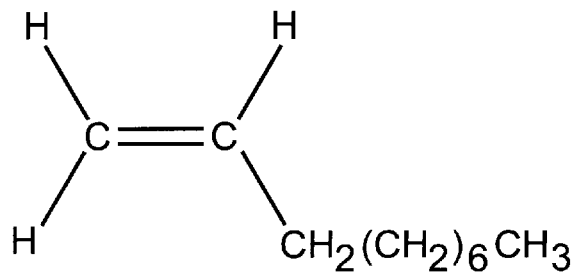
FIG. 15 is a schematic representation of a 1-decene ligand.
Figure 16:
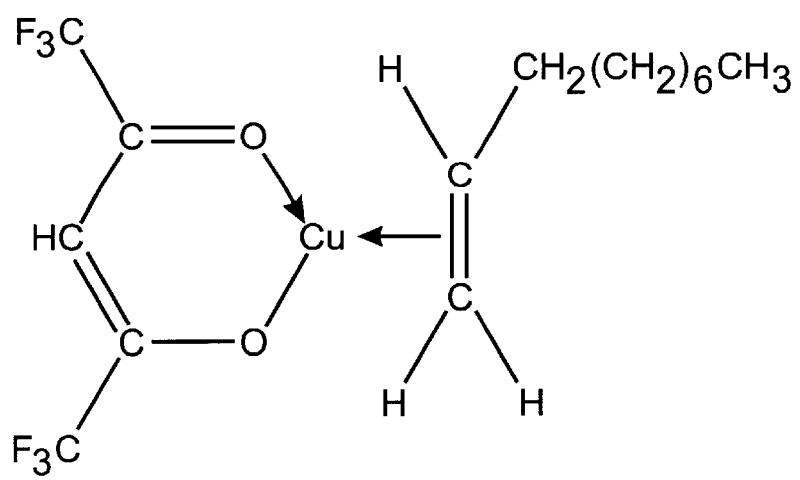
FIG. 16 is a schematic representation of a Cu precursor with the 1-decene ligand of FIG. 15.

FIG. 15 is a schematic representation of a 1-decene ligand. The first bond is H, the second bond is H, the third bond is $CH_2(CH_2)_6CH_3$, and the fourth bond is H. FIG. 16 is a schematic representation of a Cu precursor with 1-decene ligand of FIG. 15.

In some aspects of the invention, metal precursor 10 includes an additive to create a precursor blend, and in which the precursor blend comprises less than approximately 10% alkene, as measured by weight ratio of the precursor compound, to facilitate a stable liquid phase precursor. Some examples of alkene additives are shown in FIGS. 3, 5, 7, 9, 11, and 13, and a list of alkene ligands is provided, above, in the discussion of FIGS. 1 and 2.

Alternately, the volatile metal (M) precursor compound of the present invention is described by the following structural formula:

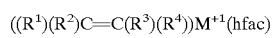

$((R^1)(R^2)C{=}C(R^3)(R^4))M^{+1}(hfac)$ in which $R^1$, $R^2$, $R^3$, and $R^4$ are selected from the group consisting of H, $C_1$ to $C_8$ alkyl, $C_1$ to $C_8$ haloalkyl, and $C_1$ to $C_8$ alkoxyl, whereby a stable alkene ligand precursor capable of high metal deposition rates is formed. As above, $R^1$, $R^2$, $R^3$, and $R^4$ vary independently from each other.

When $R^1$ is H, $R^2$ is H, $R^3$ is $CH_3$, and $R^4$ is $CH_2C(CH_3)_3$, a 2,4,4-trimethyl-1-pentene ligand is formed.

When $R^1$ is H, $R^2$ is H, $R^3$ is H, and $R^4$ is $C(CH_3)_3$, a 3,3-dimethyl-1-butene ligand is formed.

When $R^1$ is H, $R^2$ is H, $R^3$ is $CH_3$, and $R^4$ is $CH(CH_3)_2$, a 2,3-dimethyl-1-butene ligand is formed.

When $R^1$ is H, $R^2$ is $CH_3$, $R^3$ is $CH_3$, and $R^4$ is $CH_3$, a 2-methyl-2-butene ligand is formed.

When $R^1$ is H, $R^2$ is H, $R^3$ is H, and $R^4$ is $CH_2(CH_2)_2CH_3$, a 1-hexene ligand is formed.

When $R^1$ is H, $R^2$ is H, $R^3$ is H, and $R^4$ is $CH_2CH_2CH_3$, a 1-pentene ligand is formed. In some aspects of the invention, the compound includes a 1-pentene ligand additive to create a metal precursor blend. The alkene additive has the following structural formula:

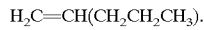

$H_2C{=}CH(CH_2CH_2CH_3)$.

When $R^1$ is H, $R^2$ is H, $R^3$ is H, and $R^4$ is $CH_2(CH_2)_6CH_3$, a 1-decene ligand is formed. Other alkene ligand combinations are possible.

The alkene additive used create a metal precursor blend from the alkene ligand precursor of the present invention, is alternately expressed by the following structural formula:

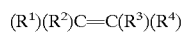

$(R^1)(R^2)C{=}C(R^3)(R^4)$ in which $R^1$, $R^2$, $R^3$, and $R^4$ are selected from the group consisting of H, $C_1$ to $C_8$ alkyl $C_1$ to $C_8$ haloalkyl, and $C_1$ to $C_8$ alkoxyl. The alkene ligand is typically less than approximately 10% by weight ratio of the precursor blend, and is preferably about 4.7%, depending on the specific alkene ligand in use.

Further, the alkene ligand selected to form the precursor is the same alkene ligand used as the additive to from the precursor blend. For example, when a 1-hexene ligand metal precursor is formed, a 1-hexene ligand is used as an additive to make a precursor blend.

Figure 17:
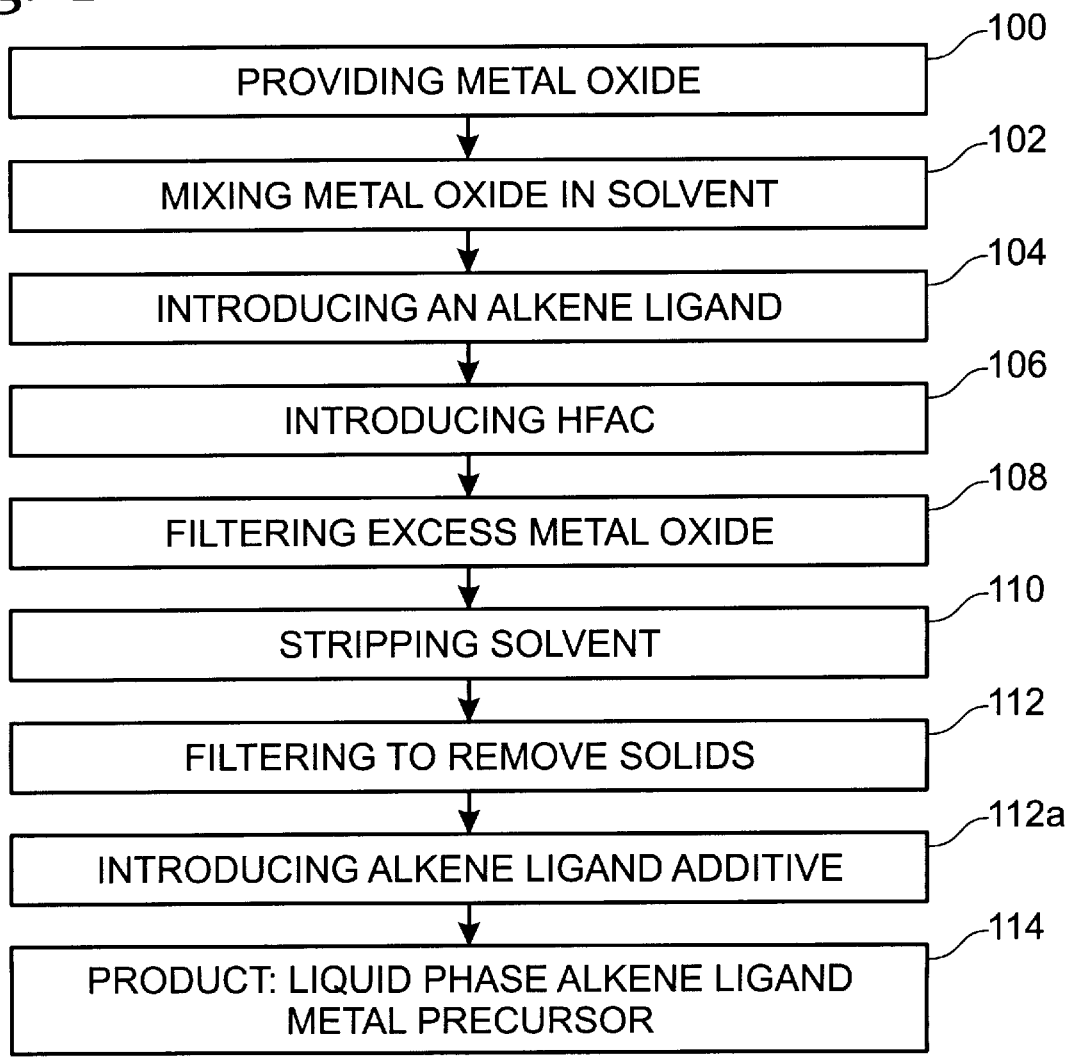
FIG. 17 illustrates steps in a method for synthesizing a copper(hfac) alkene ligand precursor.

FIG. 17 illustrates steps in a method for synthesizing a copper(hfac) alkene ligand precursor. Although the method expressly discusses the synthesis of a copper precursor, the general method is applicable for the synthesis of iridium and silver precursors. Step 100 provides copper oxide ($Cu_2O$), or the oxide of the metal to be used. Step 102 forms a uniformly mixed solution of $Cu_2O$ in a solvent. Step 102 includes using a solvent selected from the group consisting of dichloromethane and tetrahydrofuran (THF). Dichloromethane, especially, has been found to be an effective solvent. Step 104 introduces an alkene ligand to the solution of Step 102, forming a uniformly mixed solution. Step 106 introduces hexafluoroacetylacetone (hfac) to the solution of Step 104, forming a uniformly mixed solution. Step 108 filters the solution to remove solid materials, whereby any excess $Cu_2O$ is removed. Typically, Step 108 includes using celite to filter the solution, removing solid material larger than approximately 10 microns. Step 110 removes the solvent from the solution. Step 112 filters to remove the solid material. Step 112 typically includes filtering solid material having a size greater than approximately 1 micron. Step 114 is a product, where a liquid phase alkene ligand precursor is formed.

The above-mentioned method is applicable to the formation of a variety of alkene ligand precursors, a few examples are provided, below. In some aspects of the invention, Step 102 includes the $Cu_2O$ being, in proportion, 0.310 mol, Step 104 includes 2,4,4-trimethyl-1-pentene being, in proportion, 0.48 mol, and Step 106 includes the hfac being, in proportion, 0.48 mol.

In another example, Step 102 includes the $Cu_2O$ being, in proportion, 0.16 mol, Step 104 includes 3,3-dimethyl-1-butene being, in proportion, 0.24 mol, and Step 106 includes the hfac being, in proportion, 0.24 mol.

Alternately, Step 102 includes the $Cu_2O$ being, in proportion, 0.15 mol, Step 104 includes 2,3-dimethyl-1-butene being, in proportion, 0.21 mol, and Step 106 includes the hfac being, in proportion, 0.21 mol.

In one example, Step 102 includes the $Cu_2O$ being, in proportion, 0.64 mol, Step 104 includes 2-methyl-2-butene being, in proportion, 0.96 mol, and Step 106 includes the hfac being, in proportion, 0.96 mol.

Further, Step 102 includes the $Cu_2O$ being, in proportion, 0.310 mol, Step 104 includes 1-hexene being, in proportion, 0.48 mol, and Step 106 includes the hfac being, in proportion, 0.48 mol.

In another example, Step 102 includes the $Cu_2O$ being, in proportion, 0.310 mol, Step 104 includes 1-pentene being, in proportion, 0.48 mol, and Step 106 includes the hfac being, in proportion, 0.48 mol. In one aspect of the invention, Step 102 includes using dichloromethane solvent and Step 104 includes using 1-penten ligand.

Alternately, Step 102 includes the $Cu_2O$ being, in proportion, 0.310 mol, Step 104 includes 1-decene being, in proportion, 0.48 mol, and Step 106 includes the hfac being, in proportion, 0.48 mol.

In some aspects of the invention, a further step follows Step 112. Step 112a adds less than approximately 10%, by weight ratio, of the alkene ligand used in Step 104 to the solution, whereby the liquid phase stability of the precursor is improved. In some aspects of the invention, Step 112a includes adding approximately 4.7% alkene additive.

All manipulations were carried out in an air-free dry glovebox or by using standard Schlenk techniques. Solvents were purified before synthesis. Dichloromethane was refluxed and distilled over calcium hydride under an atmosphere of nitrogen prior to use. 2,4,4-Trimethyl-1-pentene, 3,3-dimethyl-1-butene, 2,3-dimehtyl-1-butene, 2-methyl-2-butene, 1-hexene, 1-pentene, 1-decene and $Cu_2O$ were purchased from Aldrich, and 1,1,1,5,5,5-hexafluoroacetylacetone, from Strem, and they were used directly without any purification.

The synthesis procedure of organometallic copper(I) complexes was firstly described by Doyle in U.S. Pat. No. 4,385,005, in which copper monoxide reacted with unsaturated organic hydrocarbon and 1,1,1,5,5,5-hexafluoroacetylacetone in dichloromethane or THF. The reaction is described by the following equation:

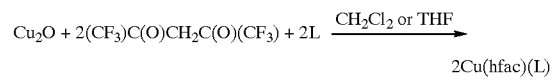

where L is an unsaturated organic hydrocarbon ligand.

The synthesized alkene copper(I)(hfac) product is not stable at room temperature for long periods of time. To solve this problem, less than 10% extra organic stabilizing ligand (by product weight) was added into the product for the compound stabilization. After one month, no solid precipitation or decomposition was observed in these stabilized products.

Synthesis Example 1

In the synthesis of (2,4,4-trimethyl-1-pentene)Cu(hfac), see FIG. 4, Cu2O (44.7 g, 0.31 mol) was added into a 500 ml round bottom flask equipped with $CH_2Cl_2$ (150 mL) and a stirring bar. The color of the solution was red. To this; $Cu_2O$ dichloromethane solution, 2,4,4-trimethyl-1-pentene (76 mL, 0.48 mol) was added and stirred at room temperature for five minutes. Then 1,1,1,5,5,5-hexafluoroacetylacetone (100 g, 0.48 mol) was added with stirring. The addition of 1,1,1,5,5,5-hexafluoroacetylacetone was completed within 2 minutes, during which the color of the solution began to gradually change to green, after about 1 minute. After addition, the solution was continually stirred for another 5 minutes, and then filtered through celite (10–25 μm filter size). The green filtrate was stripped under vacuum for two hours and then heated to 35° C. under vacuum for another half-hour stripping. During the stripping, some crystals were precipitated, and then dissolved by strong stirring. This produced a green liquid organometallic copper compound, which was then filtered through a fine filter (1 μm) to give 144.4 gram product (yield: 78.5% based on hfac, and the theoretical yield based on hfac is 184.0 gram.). The pure compound experiences partial decomposition over one or two days. To the partial decomposed compound, some red solid precipitates were seen on the bottom of glass vial or on the glass wall. To prevent the decomposition, 2,4,4-trimethyl-1-pentene (0.205 g) was introduced into the pure compound (4.027 g, and total of 4.232 g) and the mixture contained 4.844% free 2,4,4-trimethyl-1-pentene. After one month, no crystal or solid precipitate was observed in this stabilized compound.

The proton NMR structural analysis was carried out on a 300 MHz NMR instrument. The sample contained 2.4% (weight percentage) free 2,4,4-trimehtyl-1-pentene. The results are as follows: $^1$H NMR ($CD_2Cl_2$) δ 0.67 (s, 9, $CH_2=C(CH_3)CH_2C(CH_3)_3$), 1.41 (s, 3, $CH_2=C(CH_3)CH_2C(CH_3)_3$), 1.67 (s, 2, $CH_2=C(CH_3)CH_2C(CH_3)_3$), 3.73 (cis to H) (s, 1, $CH_2=C(CH_3)CH_2C(CH_3)_3$), 3.83 (trans to H) (s, 1, $CH_2=C(CH_3)CH_2C(CH_3)_3$), 6.17 (s, 1, $CF_2C(O)CHC(O)CF_3$).

Synthesis Example 2

The synthesis of (3,3-diemthyl-1-butene)Cu(I)(hfac), see FIG. 6, is similar to that of (2,4,4-trimethyl-1-pentene)Cu (hfac), in which $Cu_2O$ (22.3 g, 0.16 mol) reacted with 3,3-dimethyl-1-butene (31 mL, 0.24 mol) and 1,1,1,5,5 ,5-hexafluoroacetylacetone (34 mL, 0.24 mol) in $CH_2Cl_2$ (100 mL). After the filtration through a fine filter (1 μm), 70.2 grams of product were obtained (yield: 82.4% based on hfac, and the theoretical yield based on hfac is 85.2 gram.). The compound was stabilized by the addition of 5.14% (weight percentage) 3,3-diemthyl-1-butene. After a month, no crystal or solid precipitate was observed in the stabilized compound.

The proton NMR structural analysis was carried out on a 300 MHz NMR instrument. The sample contained 5.14% (weight percentage) 3,3-dimethyl-1-butene. The results are as follows: $^1$H NMR ($C_6D_6$) δ 0.80 (s, 9, $CH_2$=CHC($CH_3$)$_3$), 3.59 (d, 1, $J_{HH,cis}$=9.3 Hz, $CH_2$=CHC($CH_3$)$_3$), 3.75 (d, 1, $J_{HH,trans}$=16.2 Hz, $CH_2$=CHC($CH_3$)$_3$), 4.65 (quartet, 1, $J_{HH,cis}$=9.3 Hz, $J_{HH,trans}$=16.2 Hz, $CH_2$=CHC($CH_3$)$_3$), 6.15 (s, 1, ($CF_3C(O)CHC(O)CF_3$).

Synthesis Example 3

The synthesis of (2,3-diemthyl-1-butene)Cu(I)(hfac), see FIG. 8, is similar to that of (2,4,4-trimethyl-1-pentene)Cu (hfac), in which Cu2O (21 g, 0.15 mol) reacted with 3,3-dimethyl-1-butene (25 mL, 0.21 mol) and 1,1,1,5,5,5-hexafluoroacetylacetone (30 mL, 0.21 mol) in $CH_2Cl_2$ (100 mL). After the filtration through a fine filter (1 μm), a 69.1 gram product was obtained (yield: 93.1% based on hfac, and the theoretical yield based on hfac is 74.2 gram.). The compound was stabilized by the addition of 4.91% (weight percentage) 2,3-diemthyl-1-butene. After a month's observation, no crystal or solid precipitate was observed in the stabilized compound blend.

The proton NMR structural analysis was carried out on a 300 MHz NMR instrument. The sample contained 4.91% (weight percentage) 2,3-dimethyl-1-butene). The results are as follows: $^1$H NMR ($C_6D_6$) δ 0.79 (d, 6, $J_{HH}$=6 Hz, $CH_2$=C($CH_3$)CH($CH_3$)$_2$), 1.33 (s, 3, $CH_2$=C($CH_3$)CH($CH_3$)$_2$), 1.84 (sept., 1, $J_{HH}$=6 Hz, $CH_2$=C($CH_3$)CH($CH_3$)$_2$), 3.72 (cis to $CH_3$) (s, 1, $CH_2$=C($CH_3$)CH($CH_3$)$_2$), 3.81 (trans to $CH_3$) (s, 1, $CH_2$=C($CH_3$)CH($CH_3$)$_2$), 6.11 (s, 1, ($CF_3C(O)CHC(O)CF_3$).

Synthesis Example 4

The synthesis of (2-methyl-2-butene)Cu(I)(hfac), see FIG. 10, is similar to that of (2,4,4-trimethyl-1-pentene)Cu (hfac), in which Cu2O (92 g, 0.64 mol) reacted 2-methyl-2-butene (102 mL, 0.96 mol) and 1,1,1,5,5,5-hexafluoroacetylacetone (200 g, 0.96 mol) in $CH_2Cl_2$ (500 mL). After the first filtration (10–25 μm filter size), the green filtrate was stripped under vacuum for three hours at room temperature, during which lots of small crystals were precipitated. This produced a green liquid-solid product (277.4 g, yield 84.7% based on hfac). To this product, 2-methyl-2-butene (10 g, 3.48% by weight) was added and stirred for 10 minutes. The solid was dissolved and the liquid product was then filtered through a 1 μm size filter. In this liquid compound, the green-white solid was continuously precipitated, but no red decomposed solid was seen. After one month, the precipitated solid (approximately 2% by weight) was filtered off via a 1 μm size filter, and in the liquid filtrate, there was no solid precipitation observed over a two week observation. The proton NMR experiment indicated that the precipitated green-white solid is also the compound of (2-methyl-2-butene)Cu(I)(hfac), which exhibits same peak characters, but different chemical shifts comparing to the liquid part.

The proton NMR structural analysis was carried out on a 300 MHz NMR instrument. The sample was liquid compound stabilized with 3.48% 2-methyl-2-butene. The results are as follows: $^1$H NMR ($C_6D_6$) δ 1.26 (s, 3, $CH_3C(CH_3)$=$CHCH_3$), 1.32 (s, 3, $CH_3C(CH_3)$=$CHCH_3$), 1.37 (s, 3, $CH_3C(CH_3)$=$CHCH_3$), 4.41 (s, br, 1, $CH_3C(CH_3)$=$CHCH_3$), 6.07 (s, 1, ($CF_3C(O)CHC(O)CF_3$).

Synthesis Example 5

The synthesis of (1-hexene)Cu(I)(hfac), see FIG. 12, is similar to that of (2,4,4-trimethyl-1-pentene)Cu(hfac), in which Cu2O (44.7 g, 0.31 mol) reacted 1-hexene (60 mL, 0.48 mol) and 1,1,1,5,5,5-hexafluoroacetylacetone (100 g, 0.48 mol) in $CH_2C_{12}$ (150 mL). After the filtration through a fine filter (1 μm), a 69.1 gram product was obtained (yield: 93.1% based on hfac, and the theoretical yield based on hfac is 74.2 gram.). After the first filtration through celite (10–25 μm filter size), the green filtrate was stripped under vacuum for three hours at room temperature. During the stripping, some small green crystal precipitation was seen. These precipitated small crystals were later all dissolved with strong stirring. This produced a dried green liquid organometallic copper compound, which was then filtered through a fine filter (1 μm) to give 144.65 gram product (yield: 84.8% based on hfac, and the theoretical yield based on hfac is 170.5 g). The decomposition of pure compound occurred after two days, at room temperature, with the precipitation of red solid on the bottom of glass flask and on the glass wall. The compound was stabilized by the addition of 2.18% (weight percentage) 1-hexene. After a month, no crystal or solid precipitate was observed in the stabilized compound.

The proton NMR structural analysis was carried out on a 300 MHz NMR instrument. The sample contains 2.18% free 1-hexene. The results are as follows: $^1$H NMR ($C_6D_6$) δ 0.76 (t, 3, $J_{HH}$=6.5 Hz, $CH_2$=$CHCH_2(CH_2)_2CH_3$), 1.04–1.09 (multi., 4, $CH_2$=$CHCH_2(CH_2)_2CH_3$), 1.47–1.54 (multi., 2, $CH_2$=$CHCH_2(CH_2)_2CH_3$), 3.62 (d, 1, $J_{HH,cis}$=1.2 Hz, $CH_2$=$CHCH_2(CH_2)_2CH_3$,), 3.67 (d, 1, $J_{HH,trans}$=9.6 Hz, $CH_2$=$CHCH_2(CH_2)_2CH_3$), 4.53 (multi., 1, $CH_2$=$CHCH_2(CH_2)_2CH_3$), 6.18 (s, 1 ($CF_3C(O)CHC(O)CF_3$).

Synthesis Example 6

The synthesis of (1-pentene)Cu(I)(hfac), see FIG. 14, is similar to that of (2,4,4-tri-methyl-1-pentene)Cu(hfac), in which $Cu_2O$ (44.7 g, 0.31 mol) reacted 1-pentene (53 mL, 0.48 mol) and 1,1,1,5,5,5-hexafluoroacetylacetone (100 g, 0.48 mol) in $CH_2Cl_2$ (150 mL). After the first filtration through celite (10–25 μm filter size), the green filtrate was stripped under vacuum for three hours at room temperature. During the stripping, some small green crystal precipitation was seen. Not all of the precipitated small crystals were dissolved by strong stirring. After filtration through a fine filter (1 μm), a 139.6 gram product (yield: 85.3% based on hfac, and the theoretical yield based on hfac is 163.8 g) was obtained. Unlike (1-hexene)Cu(hfac), the pure compound of (1-pentene)Cu(hfac) starts to decompose after 12 hours at room temperature. The compound was stabilized by the addition of 2.29% 1-pentene. After a month, no crystal or solid precipitate was observed in the stabilized compound.

The proton NMR structural analysis was carried out on a 300 MHz NMR instrument. The sample contains 2% free 1-pentene. The results are as follows: $^1$H NMR ($C_6D_6$) δ 0.66 (t, 3, $J_{HH}$=7.2 Hz, $CH_2$=$CHCH_2CH_2CH_3$), 1.09 (hex., 2, $J_{HH}$=7.2 Hz $CH_2$=$CHCH_2CH_2CH_3$), 1.47 (quartet, 2, $J_{HH}$=6.9 Hz, $CH_2$=$CHCH_2CH_2CH_3$), 3.64 (cis to H) (s, 1, $CH_2$=$CHCH_2CH_2CH_3$), 3.68 (d, 1, $J_{HH,trans}$=7.8 Hz, $CH_2$=$CHCH_2CH_2CH_3$), 4.56 (multi., 1, $CH_2$=$CHCH_2CH_2CH_3$), 6.18 (s, 1, ($CF_3C(O)CHC(O)CF_3$).

Synthesis Example 7

The synthesis of (1-decene)Cu(I)(hfac), see FIG. 16, is similar to that of (2,4,4-trimethyl-1-pentene)Cu(hfac), in which $Cu_2O$ (44.7 g, 0.31 mol) reacted 1-decene (91 mL, 0.48 mol) and 1,1,1,5,5,5-hexafluoroacetylacetone (100 g, 0.48 mol) in $CH_2Cl_2$ (150 mL). After the first filtration through celite (10–25 μm filter size), the green filtrate was stripped under vacuum for about five hours at room temperature, during which the green solid was formed. The green solid was mostly turned to green liquid after standing at room temperature for 12 hours. The compound was strongly stirred for two hours in order to dissolve as many green solid as possible and then filtered through a fine filter (1 μm). This produced 169.9 grams of green liquid product (yield: 86.1% based on hfac, and the theoretical yield based on hfac is 197.5 g). Pure (1-decene)Cu(hfac) does not experience decomposition at room temperature, and instead, some green crystals (less than 1% weight percentage) were formed. To prevent the crystal precipitation, 2% of extra 1-decene was introduced into the product. After a month of standing, no crystal or solid precipitate was observed in the stabilized compound. The chemical and physical properties of (1-decene)Cu(hfac) are very similar to the previously reported new copper precursor (α-methylstyrene)Cu(hfac), see patent application Ser. No. 09/210,099, mentioned above, that was filed by Wei-Wei Zhuang et al. on Dec. 10, 1998.

The proton NMR structural analysis was carried out on a 300 MHz NMR instrument. The results are as follows: $^1$H NMR ($C_6D_6$) δ 0.91 (t, 3, $J_{HH}$=6.8 Hz, $CH_2$=CHCH$_2$(CH$_2$)$_6$CH$_3$), 1.11–1.32 (multi., 12, $CH_2$=CHCH$_2$(CH$_2$)$_6$CH$_3$), 1.60 (quartet, 2, $J_{HH}$=6.9 Hz, $CH_2$=CHCH$_2$(CH$_2$)$_6$CH$_3$), 3.79 (d, 1, $J_{HH,cis}$=6.9 Hz, $CH_2$=CHCH$_2$(CH$_2$)$_6$CH$_3$), 3.83 (d, 1, $J_{HH,trans}$=13.8 Hz, $CH_2$=CHCH$_2$(CH$_2$)$_6$CH$_3$), 4.69 (multi., 1, $CH_2$=CHCH$_2$(CH$_2$)$_6$CH$_3$), 6.10 (s, 1, (CF3C(O)CHC(O)CF$_3$).

The results of copper metal thin films deposition via CVD using these volatile liquid precursors were very good. The copper thin films have shown good adhesion to metal and metal nitride substrates, low resistivity (1.8 μΩ·cm), and also very good reproducibility. Some of precursors are very volatile, and thus high deposition rate has been achieved.

Similar to above seven examples, a broad of new alkene copper(I)hfac complexes can be synthesized via the reactions of copper monoxide with 1,1,1,5,5,5-hexafluoroacetylacetone and different alkene adducts, such as (3-methyl-1-butene)Cu(I)(hfac), (2-ethyl-1-butene)Cu(I)(hfac), (2-pentene)Cu(I)(hfac), (2-hexene)Cu(I)(hfac), (2,4,4-trimethyl-2-pentene)Cu(I)(hfac), (2,3-dimethyl-2-butene)Cu(I)(hfac), (n-methyl-m-pentene)Cu(I)(hfac) (n=1,2,3 and 4; m=1 and 2), (n-methyl-m-hexene)Cu(I)(hfac) (n=1,2,3 and 4; m=1 and 2), (n-methyl-m-heptene)Cu(I)(hfac) (n=1, 2,3,4,5 and 6; m=1, 2 and 3) and lots of copper(I) hfac complexes stabilized by different alkenes. Normally, alkenes with asymmetric structures produce a liquid copper(I) hfac complex with a reduced tendency to crystallize, and alkenes with a low boiling point produce a copper(I) hfac complex more volatile, but easier to decompose.

A new and improved copper precursor, and synthesis method for the copper precursor, has been disclosed above. The alkene ligand precursors, as a general class, are stable at low temperatures, and sufficiently volatile at higher temperatures. Copper deposited with the precursor has low resistivity and high adhesive characteristics. Finally, the precursor is inexpensive to make. A synthesis method has been disclosed which produces a high yield of the above-described precursor. Other variations and embodiments will occur to those skilled in the art.

What is claimed is:

1. A volatile metal (M) precursor compound for applying chemical vapor deposition (CVD) metal to selected surfaces, the precursor compound having the following structural formula:

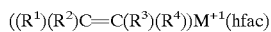

in which $R^1$, $R^2$, $R^3$, and $R^4$ are selected from the group consisting of H, $C_1$ to $C_8$ alkyl, $C_1$ to $C_8$ haloalkyl, and $C_1$ to $C_8$ alkoxyl, whereby a stable alkene ligand precursor capable of high metal deposition rates is formed, the compound further including an alkene additive to create a metal precursor blend, the additive being less than approximately 10% by weight ratio of the precursor blend, the alkene additive having the following structural formula:

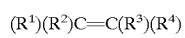

in which $R^1$, $R^2$, $R^3$, and $R^4$ are selected from the group consisting of H, $C_1$ to $C_8$ alkyl, $C_1$ to $C_8$ haloalkyl, and $C_1$ to $C_8$ alkoxyl, whereby the precursor is further stabilized in a liquid phase.

2. A volatile metal (M) precursor compound for the chemical vapor deposition (CVD) of metal to selected surfaces, the precursor compound comprising:

$M^{+1}$(hexafluoroacetylacetonate); and an alkene ligand including a first and second bond to a first carbon atom, and a third and fourth bond to a second carbon atom, in which said first bond is H, said second bond is H, said third bond is $C(CH_3)_3$, and said fourth bond is H, whereby a 3,3-dimethyl-1-butene ligand is formed.

3. A volatile metal (M) precursor compound for the chemical vapor deposition (CVD) of metal to selected surfaces, the precursor compound comprising:

$M^{+1}$(hexafluoroacetylacetonate), and an alkene ligand including a first and second bond to a first carbon atom, and a third and fourth bond to a second carbon atom, in which said first bond is H, said second bond is H, said third bond is $CH_3$, and said fourth bond is $CH(CH_3)_2$, whereby a 2,3-dimethyl-1-butene ligand is formed.

4. A volatile metal (M) precursor compound for the chemical vapor deposition (CVD) of metal to selected surfaces, the precursor compound comprising:

$M^{+1}$(hexafluoroacetylacetonate), and an alkene ligand including a first and second bond to a first carbon atom, and a third and fourth bond to a second carbon atom, in which said first bond is H, said second bond is $CH_3$, said third bond is $CH_3$, and said fourth bond is $CH_3$, whereby a 2-methyl-2-butene ligand is formed.

5. A volatile metal (M) precursor compound for the chemical vapor deposition (CVD) of metal to selected surfaces, the precursor compound comprising:

$M^{+1}$(hexafluoroacetylacetonate); and an alkene ligand including a first and second bond to a first carbon atom, and a third and fourth bond to a second carbon atom, in which said first bond is H, said second bond is H, said third bond is $CH_2(CH_2)_2CH_3$, and said fourth bond is H, whereby a 1-hexene ligand is formed.

6. A volatile metal (M) precursor compound for the chemical vapor deposition (CVD) of metal to selected surfaces, the precursor compound comprising:

$M^{+1}$(hexafluoroacetylacetonate); and an alkene ligand including a first and second bond to a first carbon atom, and a third and fourth bond to a second carbon atom, in which said first bond is H, said second bond is H, said third bond is $CH_2CH_2CH_3$, and said fourth bond is H, whereby a 1-pentene ligand is formed, and wherein the 1-pentene ligand precursor compound includes an additive to create a precursor blend, and in which the precursor blend comprises:
less than approximately 10% 1-pentene, as measured by weight ratio of the precursor compound, to facilitate a stable liquid phase precursor.

7. A volatile metal (M) precursor compound, including an additive to create a precursor blend, for the chemical vapor deposition (CVD) of metal to selected surfaces, the precursor compound and additive comprising:

$M^{+1}$(hexafluoroacetylacetonate);

an alkene ligand including a first and second bond to a first carbon atom, and a third and fourth bond to a second carbon atom, with said first, second, third, and fourth bonds being selected from a the group consisting of H, $C_1$ to $C_8$ alkyl, $C_1$ to $C_8$ haloalkyl, and $C_1$ to $C_8$ alkoxyl, whereby a stable precursor capable of high metal deposition rates is formed; and the precursor blend further including less than approximately 10% 1-pentene, as measured by weight ratio of the precursor compound, to facilitate a stable liquid phase precursor.

8. A volatile metal (M) precursor compound for applying chemical vapor deposition (CVD) metal to selected surfaces, the precursor compound having the following structural formula:

$$((R^1)(R^2)C=C(R^3)(R^4))M^{+1}(hfac)$$

in which $R^1$ is H, $R^2$ is H, $R^3$ is H, and $R^4$ is $C(CH_3)_3$, whereby a 3,3-dimethyl-1-butene ligand is formed.

9. A volatile metal (M) precursor compound for applying chemical vapor deposition (CVD) metal to selected surfaces, the precursor compound having the following structural formula:

$$((R^1)(R^2)C=C(R^3)(R^4))M^{+1}(hfac)$$

in which $R^1$ is H, $R^2$ is H, $R^3$ is $CH_3$, and $R^4$ is $CH(CH_3)_2$, whereby a 2,3-dimethyl-1-butene ligand is formed.

10. A volatile metal (M) precursor compound for applying chemical vapor deposition (CVD) metal to selected surfaces, the precursor compound having the following structural formula:

$$((R^1)(R^2)C=C(R^3)(R^4))M^{+1}(hfac)$$

in which $R^1$ is H, $R^2$ is $CH_3$, $R^3$ is $CH_3$, and $R^4$ is $CH_3$, whereby a 2-methyl-2-butene ligand is formed.

11. A volatile metal (M) precursor compound for applying chemical vapor deposition (CVD) metal to selected surfaces, the precursor compound having the following structural formula:

$$((R^1)(R^2)C=C(R^3)(R^4))M^{+1}(hfac)$$

in which $R^1$ is H, $R^2$ is H, $R^3$ is H, and $R^4$ is $CH_2(CH_2)_2CH_3$, whereby a 1-hexene ligand is formed.

12. A method for synthesizing a copper(hfac) alkene ligand precursor comprising the steps of:
a) forming a uniformly mixed solution of $Cu_2O$ in a solvent;
b) introducing an alkene ligand to the solution of Step a), and forming a uniformly mixed solution;
c) introducing hexafluoroacetylacetone (hfac) to the solution of Step b), and forming a uniformly mixed solution;

d) filtering the solution to remove solid materials, whereby any excess $Cu_2O$ is removed;
e) removing the solvent from the solution; and
f) filtering to remove the solid material, whereby a liquid phase precursor is formed.

13. A method as in claim 12 in which Step a) includes the $Cu_2O$ being, in proportion, 0.310 mol, in which Step b) includes 2,4,4-trimethyl-1-pentene being, in proportion, 0.48 mol, and in which Step c) includes the hfac being, in proportion, 0.48 mol.

14. A method as in claim 12 in which Step a) includes the $Cu_2O$ being, in proportion, 0.16 mol, in which Step b) includes 3,3-dimethyl-1-butene being, in proportion, 0.24 mol, and in which Step c) includes the hfac being, in proportion, 0.24 mol.

15. A method as in claim 12 in which Step a) includes the $Cu_2O$ being, in proportion, 0.15 mol, in which Step b) includes 2,3-dimethyl-1-butene being, in proportion, 0.21 mol, and in which Step c) includes the hfac being, in proportion, 0.21 mol.

16. A method as in claim 12 in which Step a) includes the $Cu_2O$ being, in proportion, 0.64 mol, in which Step b) includes 2-methyl-2-butene being, in proportion, 0.96 mol, and in which Step c) includes the hfac being, in proportion, 0.96 mol.

17. A method as in claim 12 in which Step a) includes the $Cu_2O$ being, in proportion, 0.310 mol, in which Step b) includes 1-hexene being, in proportion, 0.48 mol, and in which Step c) includes the hfac being, in proportion, 0.48 mol.

18. A method as in claim 12 in which Step a) includes the $Cu_2O$ being, in proportion, 0.310 mol, in which Step b) includes 1-pentene being, in proportion, 0.48 mol, and in which Step c) includes the hfac being, in proportion, 0.48 mol.

19. A method as in claim 12 in which Step a) includes the $Cu_2O$ being, in proportion, 0.310 mol, in which Step b) includes 1-decene being, in proportion, 0.48 mol, and in which Step c) includes the hfac being, in proportion, 0.48 mol.

20. A method as in claim 12 in which Step d) includes removing solid material larger than approximately 10 microns.

21. A method as in claim 20 in which Step d) includes using celite to filter the solution.

22. A method as in claim 12 in which Step a) includes using a solvent selected from the group consisting of dichloromethane and tetrahydrofuran (THF).

23. A method as in claim 22 in which Step a) includes using dichloromethane solvent, and Step b) includes using 1-penten ligand.

24. A method as in claim 12 in which Step f) includes filtering solid material having a size greater than approximately 1 micron.

25. A method as in claim 12 comprising a further step, following Step f), of:
g) adding less than approximately 10%, by weight ratio, of the alkene ligand used in Step b) to the solution, whereby the liquid phase stability of the precursor is improved.

26. A method as in claim 25 in which Step g) includes adding approximately 4.7% alkene additive.

* * * * *